(12) United States Patent
Lee et al.

(10) Patent No.: US 9,337,240 B1
(45) Date of Patent: May 10, 2016

(54) INTEGRATED CIRCUIT PACKAGE WITH A UNIVERSAL LEAD FRAME

(75) Inventors: Guan Khai Lee, Mertajam (MY); Loon Kwang Tan, Kepala Batas (MY); Ping Chet Tan, Gelugor (MY); Pheak Ti Teh, Jitra (MY)

(73) Assignee: Altera Corporation, San Jose, CA (US)

( * ) Notice: Subject to any disclaimer, the term of this patent is extended or adjusted under 35 U.S.C. 154(b) by 36 days.

(21) Appl. No.: 12/819,141

(22) Filed: Jun. 18, 2010

(51) Int. Cl.
| | |
|---|---|
| *H01L 21/56* | (2006.01) |
| *H01L 27/32* | (2006.01) |
| *H01L 27/12* | (2006.01) |
| *H01L 29/66* | (2006.01) |

(52) U.S. Cl.
CPC ............ *H01L 27/32* (2013.01); *H01L 27/1288* (2013.01); *H01L 29/66742* (2013.01)

(58) Field of Classification Search
CPC ................. H01L 2924/00; H01L 2224/48347; H01L 2224/48465; H01L 2224/49171; H01L 2224/48227; H01L 2224/48257; H01L 2924/01082; H01L 2924/01029; H01L 2924/014; H01L 2224/49175; H01L 2224/49109; H01L 23/3107; H01L 23/49541; H01L 2224/49113; H01L 23/49503; H01L 23/49575; H01L 23/4951; H01L 2224/48237; H01L 33/54; H01L 2224/32227
USPC .................. 257/676, 666, E23.124, E23.043, 257/E23.046, E21.506, E23.037, E23.052, 257/692, 778, 670, 675, E23.07, E23.114, 257/659, 678, 737; 438/123, 124, 127; 362/719, 813, 235

See application file for complete search history.

(56) References Cited

U.S. PATENT DOCUMENTS

| | | | | |
|---|---|---|---|---|
| 4,534,105 | A * | 8/1985 | Reusch ........................ | 257/676 |
| 5,691,935 | A * | 11/1997 | Douglass ..................... | 365/149 |
| 5,780,772 | A * | 7/1998 | Singh et al. .................. | 174/529 |
| 6,225,685 | B1 * | 5/2001 | Newman et al. .............. | 257/666 |
| 6,265,762 | B1 * | 7/2001 | Tanaka et al. ................. | 257/676 |
| 6,297,078 | B1 * | 10/2001 | Barrow ........................ | 438/127 |
| 6,774,479 | B2 * | 8/2004 | Schatzler et al. ............ | 257/695 |
| 8,039,947 | B2 * | 10/2011 | Punzalan et al. ............. | 257/692 |
| 8,110,913 | B2 * | 2/2012 | Do et al. ....................... | 257/692 |
| 8,120,150 | B2 * | 2/2012 | Badakere Govindaiah et al. ............................ | 257/676 |
| 8,395,246 | B2 * | 3/2013 | Yu et al. ....................... | 257/676 |
| 2002/0121682 | A1 * | 9/2002 | Azcarate et al. ............. | 257/675 |
| 2008/0290483 | A1 * | 11/2008 | Yurino ......................... | 257/670 |
| 2009/0072366 | A1 * | 3/2009 | Badakere Govindaiah et al. ............................ | 257/676 |
| 2010/0062570 | A1 * | 3/2010 | Test ............................. | 438/123 |
| 2011/0089556 | A1 * | 4/2011 | Lee et al. ..................... | 257/692 |

* cited by examiner

*Primary Examiner* — Thao X Le
*Assistant Examiner* — Edward Chin
(74) *Attorney, Agent, or Firm* — Womble Carlyle Sandridge & Rice LLP

(57) ABSTRACT

A lead frame for an integrated circuit (IC) package is disclosed. The lead frame includes a center region and a plurality of lead fingers surrounding the center region. The plurality of lead fingers that surrounds the center region defines a periphery region around the center region. A portion of the plurality of lead fingers extends from the center region to hold the center region in place. Tie bars that are typically used to hold the center region in place may not be included in the lead frame.

19 Claims, 6 Drawing Sheets

INTEGRATED CIRCUIT PACKAGE WITH A UNIVERSAL LEAD FRAME

BACKGROUND

Lead frames are generally used in various types of integrated circuit (IC) packages. Different types of IC packages that incorporate a lead frame include, among others, quad flat packages (QFPs), quad flat no-lead (QFN) packages, etc. In most, if not all, of these IC packages, the lead frame acts as a mechanical support structure for the IC or die.

A lead frame typically includes a die attach paddle, leads and tie bars. The die attach paddle, held in place by the tie bars, is an area on the lead frame where the IC or die is placed. The leads connect the IC in the IC package to external circuit elements. Typically, wires are used to connect the IC on the die attach paddle to the leads. Some of the leads may be tied to a high voltage level, e.g., a positive voltage level, while others may be tied to a low voltage level, e.g., a ground potential.

Depending on the resources available, e.g., input/output (I/O) pins, on the IC, the leads may be arranged differently. As such, different lead frame designs may be required, depending on the resources available on the design of the IC. Generally speaking, the tie bars that hold the die attach paddle in place take up a certain amount of space at each of the corners of the lead frame. Therefore, the leads typically have to be arranged at a certain angle and there needs to be adequate spacing between the leads and the tie bars. Longer wires may need to be used to connect the IC on the die attach paddle to some of the leads at each corner of the lead frame.

It is desirable therefore to have a more uniform lead frame design that can accommodate different ICs. It is also desirable to have a lead frame without tie bars that occupy a substantially large area at each of the corners of the lead frame. It is within this context that the invention arises.

SUMMARY

The following embodiments describe a universal lead frame structure for IC packages.

It should be appreciated that the present invention can be implemented in numerous ways, such as a process, an apparatus, a system, or a device. Several inventive embodiments of the present invention are described below.

In one embodiment, a lead frame is disclosed. The lead frame includes a center region and a plurality of lead fingers. The plurality of lead fingers defines a periphery region around the center region and at least a portion of the plurality of lead fingers extends from the center region to hold the center region in place. In one embodiment, the lead fingers have varying lengths. In another embodiment, the center region is a die attach paddle and tie bars that are typically used to hold the die attach paddle in place are not included in the lead frame.

In another embodiment, a lead frame for an integrated circuit (IC) package is disclosed. The lead frame has a center region and lead fingers with different lengths. Each of the lead fingers has an inwardly extending end that defines a periphery region surrounding the center region. A first group of the lead fingers has a first length and a second group of the lead fingers has a second length. At least some of the second group of lead fingers have inwardly extending ends that are substantially wider than the inwardly extending ends of the first group of lead fingers.

In yet another embodiment in accordance with the present invention, a wire bond IC package is disclosed. The wire bond IC package includes a lead frame having a die attach paddle and a plurality of lead fingers. Some of the lead fingers extend in two dimensions while others extend in a single dimension. The lead fingers are arranged such that a lead finger that extends in a single dimension is placed adjacent to two lead fingers that extend in two dimensions. An IC with a plurality of die pads is disposed on the surface of the die attach paddle. A plurality of wires connects each of the die pads to either the surface of the die attach paddle or one of the plurality of lead fingers surrounding the die attach paddle.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DETAILED DESCRIPTION

The following embodiments describe a universal lead frame structure and IC packages with a universal lead frame.

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create a lead frame with a uniform structure that can accommodate different IC designs. One of the embodiments described below includes a lead frame with lead fingers that have different lengths. The lead frame in one of the embodiments includes a die attach paddle and lead fingers that extend directly from the die attach paddle. According to one embodiment, the lead frame does not include a tie bar and the die attach paddle is held in place by the lead fingers. According to another embodiment, the lead frame has lead fingers that have different lengths. For instance, some of the lead fingers are longer than others and extend closer towards the die attach paddle. The inner ends of some of the lead fingers that extend towards the die attach paddle may also be wider than some of the other lead fingers. Having lead fingers of different lengths that extend closer to the die attach paddle allows shorter wires to be used when connecting an IC that is placed on the die attach paddle to the numerous lead fingers surrounding the die attach paddle.

Figure 1A:
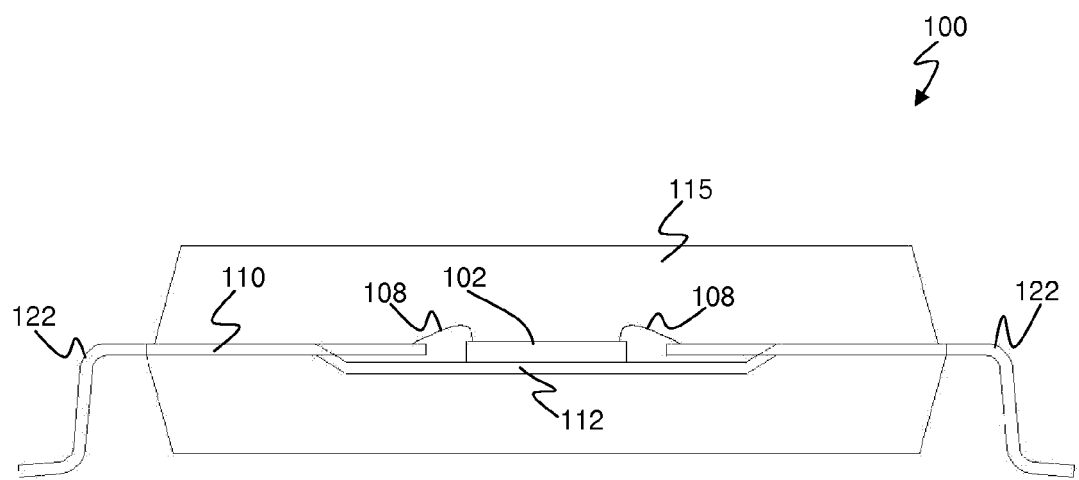
FIG. 1A, meant to be illustrative and not limiting, shows an IC package with a lead frame.

FIG. 1A, meant to be illustrative and not limiting, shows IC package 100 with lead frame 110. It should be appreciated that IC package 100 is a quad flat package (QFP) that includes a lead frame 110. It should also be appreciated that well-known components that are common in a lead frame package such as IC package 100 are not shown or described in detail in order not to unnecessarily obscure the present invention. IC 102 is placed on die attach paddle 112, at a center region of lead frame 110. Adhesive is generally used to attach IC 102 to die attach paddle 112. Wires 108 connect IC 102 to lead frame 110. Mold compound 115, e.g. epoxy mold compound, surrounds lead frame 110 and IC 102 in IC package 100. Lead fingers 122 on lead frame 110 extend from each of the four sides of IC package 100.

Figure 1B:
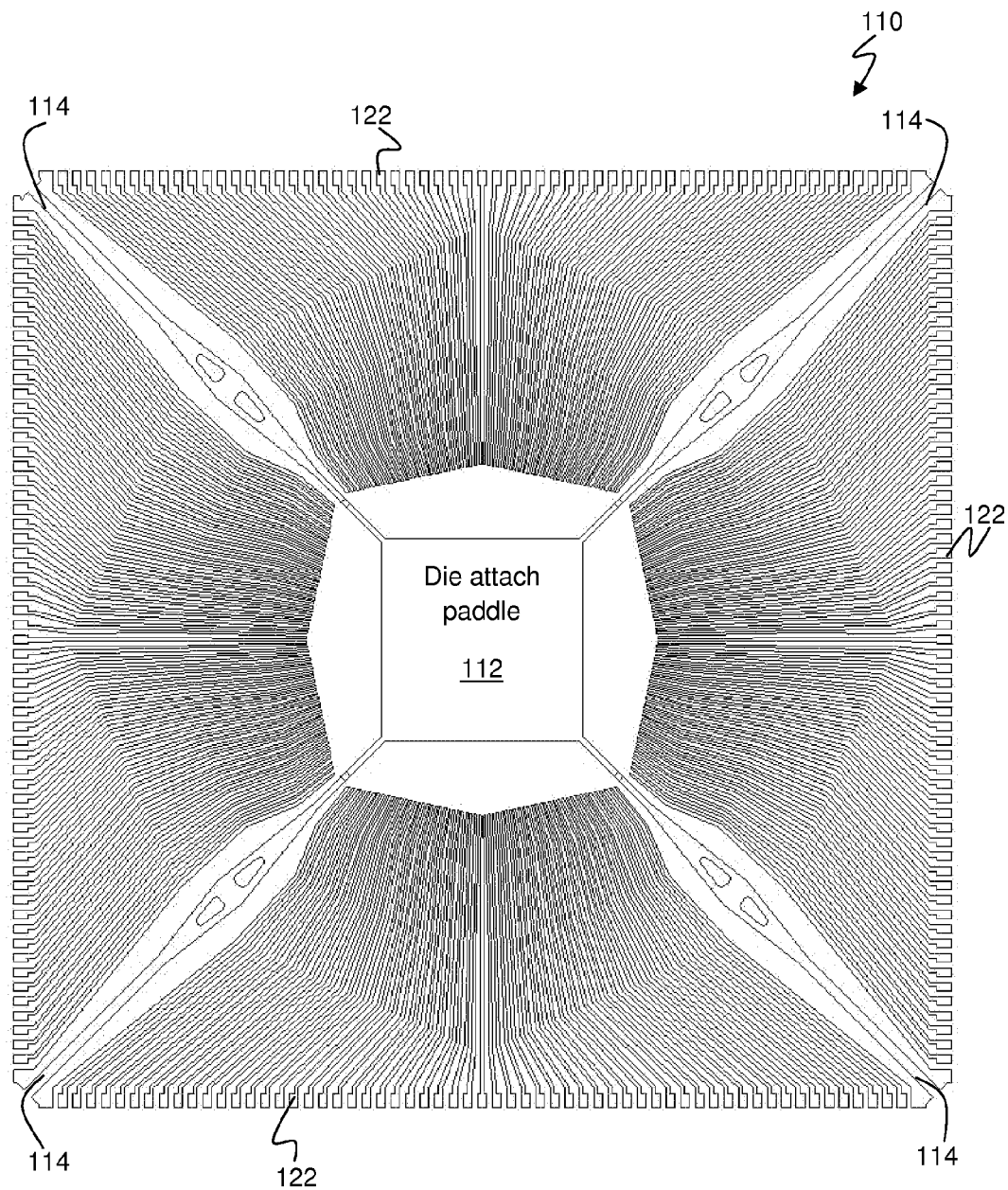
FIG. 1B, meant to be illustrative and not limiting, shows a more detailed representation of a lead frame.
Figure 1C:
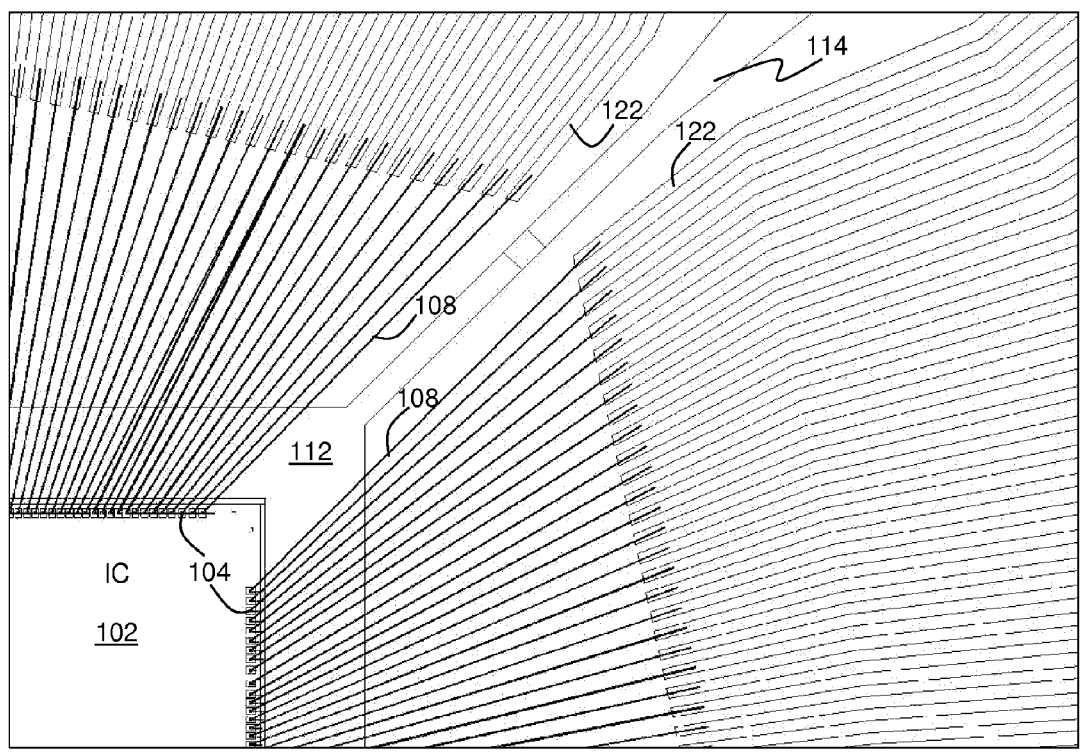
FIG. 1C, meant to be illustrative and not limiting, shows a more detailed representation of the top right portion of the lead frame with an IC and wires connecting the IC to lead fingers on the lead frame.

FIG. 1B, meant to be illustrative and not limiting, shows a more detailed representation of lead frame 110. For the sake of brevity, components on lead frame 110 that have been shown in FIG. 1A and described above, e.g., lead fingers 122 and die attach paddle 112, will not be described in detail here. Tie bars 114 at each corner of lead frame 110 hold die attach paddle 112 in place. Tie bars 114 occupy a substantially wide area at each corner of lead frame 110. As an illustrative example, the widest distance between one of the tie bars 114 with an adjacent lead finger 122 is over 800 μm. Lead fingers 122 are arranged in such a way that allows tie bars 114 to be placed at each corner of lead frame 110. FIG. 1C, meant to be illustrative and not limiting, shows a more detailed representation of the top right portion of lead frame 110. In FIG. 1C, wires 108 connect IC 102 to lead fingers 122 through die pads 104 on the top surface of IC 102.

Figure 2A:
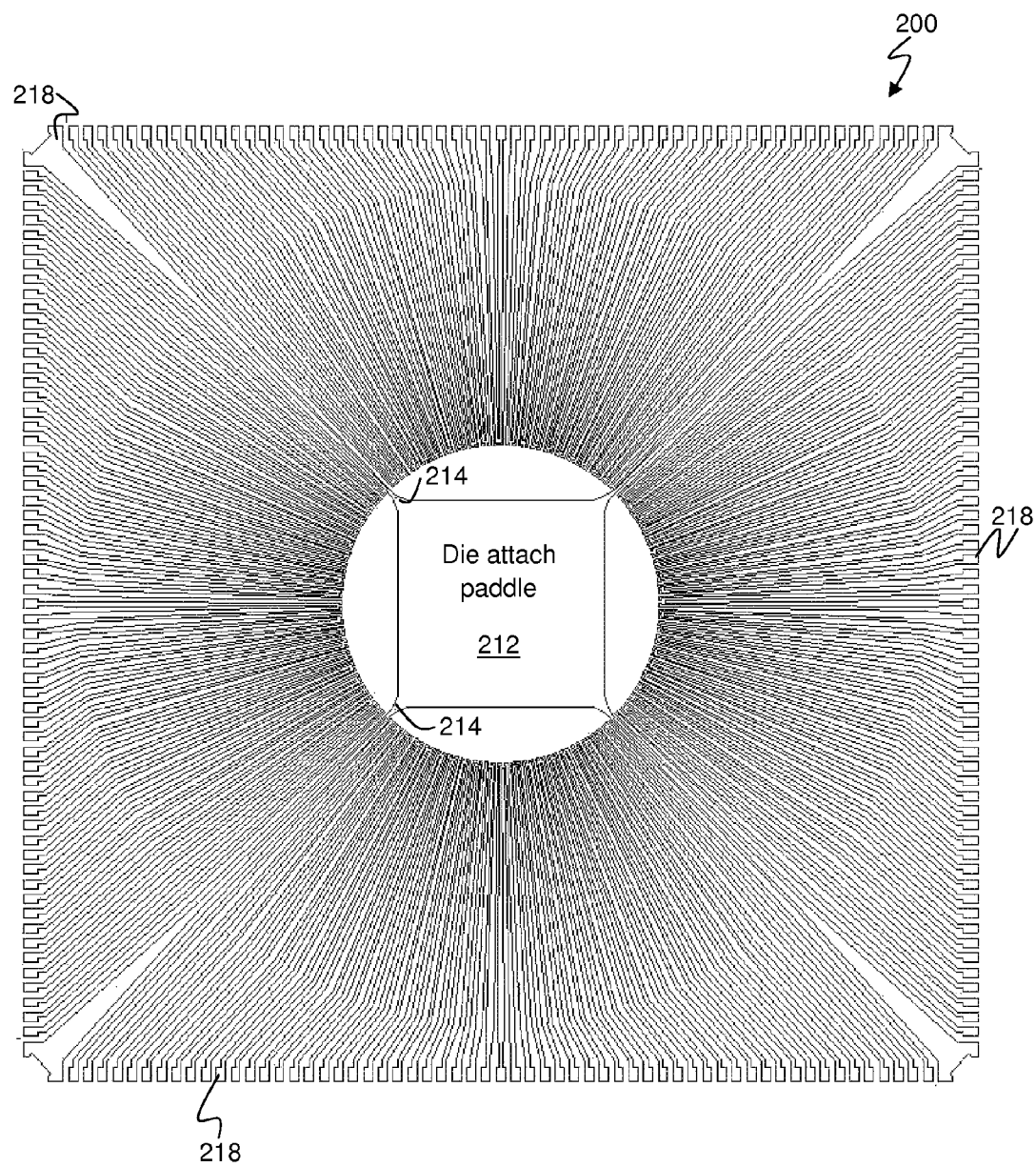
FIG. 2A, meant to be illustrative and not limiting, shows a lead frame without tie bars as one embodiment in accordance with the present invention.

FIG. 2A, meant to be illustrative and not limiting, shows lead frame 200 without tie bars as one embodiment in accordance with the present invention. Die attach paddle 212 is disposed within a center region of lead frame 200. One end of lead fingers 218 define a periphery region around die attach paddle 212 and the center region of lead frame 200. According to one embodiment, lead fingers 218 have varying lengths. In the embodiment of FIG. 2A, the inwardly extending ends of lead fingers 218 form a substantially circular peripheral region around die attach paddle 212. In another embodiment, the inwardly extending ends of lead fingers 218 form a concentric peripheral region around the center of die attach paddle 212. Some of lead fingers 218 are utilized to hold the die attach paddle in place. In the embodiment of FIG. 2A, the center region is a quadrilateral surface, i.e., the center region is a substantially flat surface with four sides, and the four corners 214 of die attach paddle 212 are directly connected to lead fingers 218. In one embodiment, lead fingers 218 are tied to a logic low level, e.g., ground, VSS, etc., and die attach paddle 212 is tied to the logic low level through the four corners 214 that are connected to lead fingers 218. Even though lead fingers 218 extend from the four corners of die attach paddle 212 in the embodiment of FIG. 2A, it should be appreciated that lead fingers 218 may extend from any of the sides of die attach paddle 212 to hold die attach paddle 212 in place in this context. In addition, die attach paddle 212 may be any suitable geometric shape and is not limited to the quadrilateral shape illustrated herein.

Figure 2B:
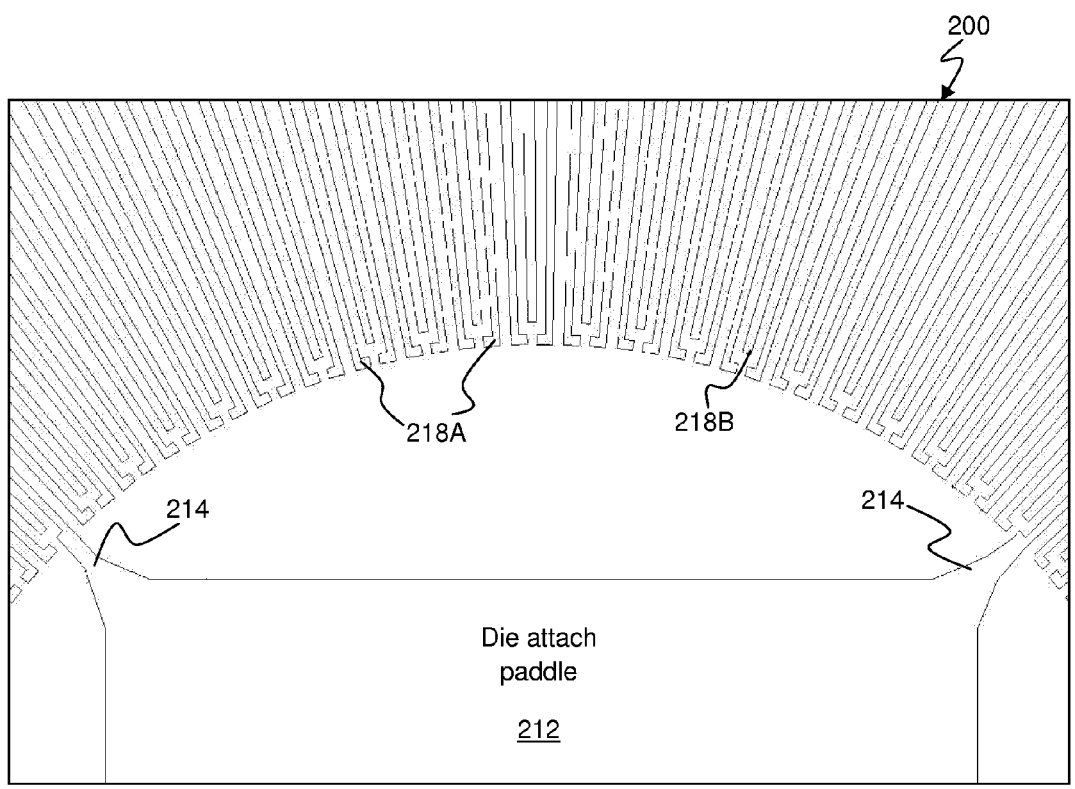
FIG. 2B, meant to be illustrative and not limiting, shows a more detailed representation of the top portion of the lead frame as one embodiment in accordance with the present invention.

FIG. 2B, meant to be illustrative and not limiting, shows a more detailed representation of the top portion of lead frame 200 as one embodiment in accordance with the present invention. As shown in the embodiment of FIG. 2B, lead fingers 218A are longer than lead fingers 218B. That is, lead fingers 218A extend further inward toward the center region. The ends of lead fingers 218A defining the periphery region are wider than the inner ends of lead fingers 218B. The four corners 214 of die attach paddle 212 are connected to four of the lead fingers 218A with wider inner ends that extend to die attach paddle 212. The inner end of each of lead fingers 218A has a protruding side. In the embodiment of FIG. 2B, each of lead fingers 218A has an L-shaped inner end and one lead finger 218B is placed in between a gap that is created by two adjacent L-shaped lead fingers 218A facing each other.

Referring still to FIG. 2B, it should be appreciated that even though L-shaped lead fingers 218A are shown in this embodiment, lead fingers with inner ends shaped differently can be used in this context. For instance, a first group of the lead fingers may be shaped such that the inner ends extending towards the die attach paddle are wider compared the inner ends of a second group of the lead fingers. According to one embodiment, a first group of lead fingers, i.e., lead fingers 218B, extends in a single dimension towards die attach paddle 212. A second group of lead fingers, i.e., lead fingers 218A, may be longer than the first group of lead fingers and extends in two dimensions. The two dimensions include a first dimension extending toward die attach paddle 212 and a second dimension that is substantially orthogonal to the first dimension. In an exemplary embodiment, the inner ends of the first group of lead fingers, i.e., lead fingers 218B, is less than 80 μm while the inner ends of the second group of lead fingers, i.e., lead fingers 218A is more than 100 μm wide. It should be appreciated that the ends of lead fingers 218B may also have different shapes than the inwardly facing L-shaped shoulder of alternate lead fingers. For example, the ends may be elliptical, triangular, or any other suitable geometric shape combined with the alternating length of adjacent lead fingers as depicted herein.

Figure 2C:
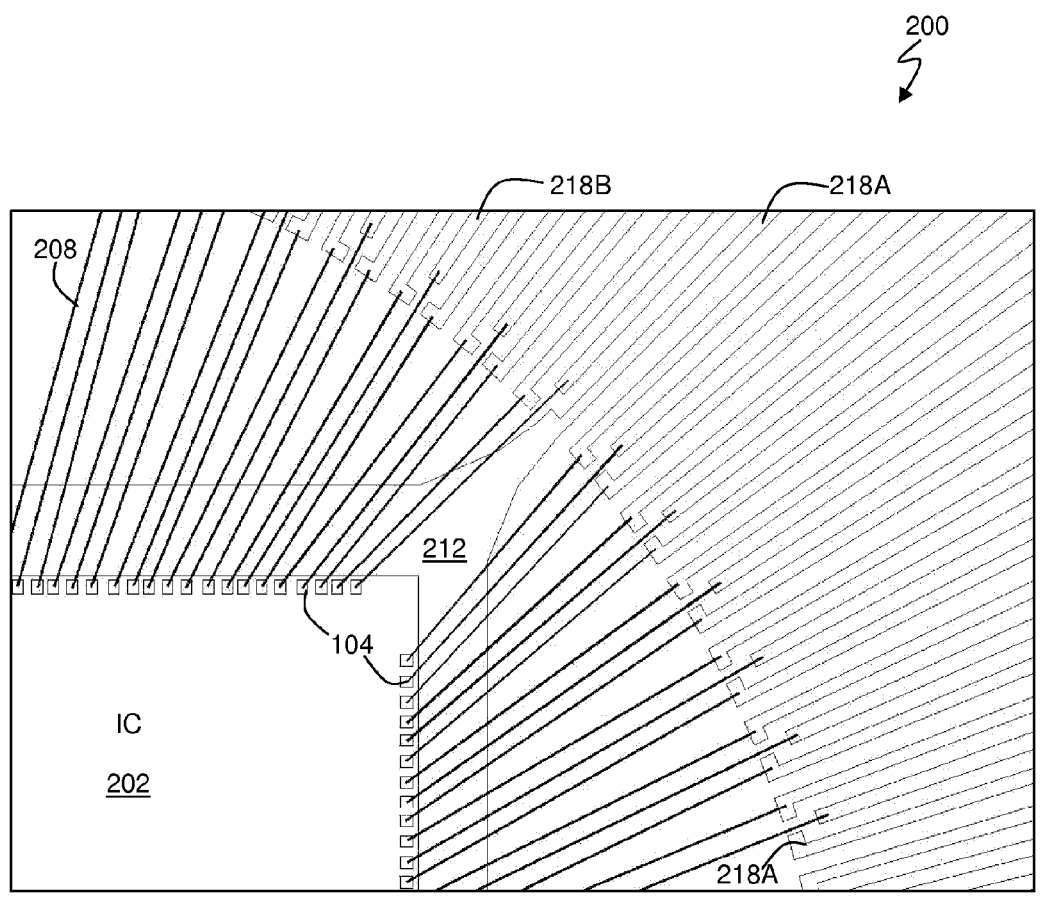
FIG. 2C, meant to be illustrative and not limiting, shows the top right portion of the lead frame with an IC disposed on the die attach paddle as one embodiment in accordance with the present invention.

FIG. 2C, meant to be illustrative and not limiting, shows the top right portion of lead frame 200 with IC 202 disposed on die attach paddle 212 as one embodiment in accordance with the present invention. In one embodiment, lead frame 200 with IC 202 may be integrated in a wire bond IC package or an IC package similar to IC package 100 shown in FIG. 1A. Wires 208 connect IC 202 on die attach paddle 212 to lead fingers 218A and 218B. IC 202 is electrically connected to lead frame 200 through die pads 104 and wires 208. In one embodiment, wires 208 are gold (Au) wires and lead frame 200 is a copper (Cu) lead frame. Because there is no tie bar holding down die attach paddle 212, lead fingers 218A and 218B in the embodiment of FIGS. 2A, 2B and 2C can extend substantially closer to die attach paddle 212 compared to lead fingers 122 in the embodiment of FIGS. 1B and 1C. Therefore, relatively shorter wires 208 can be used in the embodiment of FIG. 2C compared to wires 108 used in the embodiment of FIG. 1C.

Referring still to FIG. 2C, die attach paddle 212 is connected to a logic low level, e.g., ground, VSS, according to one embodiment. Wires 208 may be connected to either one of lead fingers 218A/B or die attach paddle 212. For instance, if a certain wire needs to be connected to ground or VSS, then it can be connected to die attach paddle 212 which also acts as a ground or VSS plane in the embodiment of FIG. 2C. Well-known wire bonding techniques are not described in detail here in order not to unnecessarily obscure the present invention. It should be appreciated that wires 208 may be connected differently based on the IC or device placed on lead frame 200.

One skilled in the art will appreciate that a specific wire bond package is provided in the exemplary illustration of FIG. 1A and a QFP lead frame is provided in the exemplary illustrations of FIGS. 1B/C and 2A/B/C. However, this is not meant to be limiting as the techniques described herein may be applied to other packaging configurations, e.g., plastic J-lead chip carrier (PLCC), plastic dual in-line package (PDIP), small outline circuit package (SOIC), etc.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A lead frame, comprising:
a center region;
a die attach paddle disposed within the center region; and
a plurality of lead fingers defining a periphery region around the center region, wherein at least one of the plurality of lead fingers extends from the center region, wherein the at least one of the plurality of lead fingers is connected to at least one corner of the die attach paddle so as to hold the die attach paddle in place in a completed IC (integrated circuit) package, and wherein each of the plurality of lead fingers is configured to extend external to a side of the completed IC package.

2. The lead frame of claim 1, wherein the plurality of lead fingers have varying lengths.

3. The lead frame of claim 1, wherein inner ends of a first portion of the plurality of lead fingers are wider than inner ends of a second portion of the plurality of lead fingers.

4. The lead frame of claim 1, wherein the center region is a ground plane that is tied to ground through the portion of the plurality of lead fingers.

5. The lead frame of claim 1, further comprising:
an integrated circuit (IC) die disposed on a surface of the die attach paddle;
a plurality of die pads disposed on a perimeter of a surface of the IC die; and
a plurality of wires connecting the plurality of die pads to one of the surface of the die attach paddle or the plurality of lead fingers.

6. The lead frame of claim 1, wherein the lead frame is integrated into a semiconductor device package.

7. A lead frame in an integrated circuit (IC) package, comprising:
a center region;
a die attach paddle disposed within the center region;
a first plurality of lead fingers having a first length; and
a second plurality of lead fingers having a second length, wherein each of the first and second pluralities of lead fingers has an outwardly extending end external to a side of the integrated circuit package, wherein each of the first and second pluralities of lead fingers has an inwardly extending end defining a periphery region surrounding the center region, wherein the inwardly extending end of the second plurality of lead fingers is wider than the inwardly extending end of the first plurality of lead fingers, and wherein a portion of the inwardly extending end of the second plurality of lead fingers is connected to corners of the die attach paddle thereby holding the die attach paddle in place in the integrated circuit package.

8. The lead frame of claim 7, wherein the second length is greater than the first length.

9. The lead frame of claim 7 wherein the inwardly extending end of the second plurality of lead fingers has at least one protruding side.

10. The lead frame of claim 9, wherein the protruding side extends from the center region, holding the center region in place.

11. The lead frame of claim 7, wherein the center region is connected to a logic low level.

12. The lead frame of claim 7, wherein the inwardly extending ends form a substantially circular peripheral region around the center region.

13. The lead frame of claim 7, wherein the die attach paddle is a quadrilateral surface with each corner directly connected to one of the second plurality of lead fingers.

14. A wire bond integrated circuit (IC) package, comprising:
a lead frame having a die attach paddle and a plurality of lead fingers, the plurality of lead fingers arranged such that adjacent lead fingers to one of the plurality of lead fingers extend in two directions while the one of the plurality of lead fingers extends in a single direction, wherein at least one of the plurality of lead fingers is connected to a corresponding corner of the die attach paddle and thus holding the die attach paddle in place in the wire bond integrated circuit package, and wherein each of the plurality of lead fingers extends to an exterior from a side of the wire bond integrated circuit package;
an IC disposed on a surface of the die attach paddle;
a plurality of die pads disposed on a perimeter of a top surface of the IC; and
a plurality of wires connecting each of the plurality of die pads to one of the surface of the die attach paddle or one of the plurality of lead fingers.

15. The wire bond IC package of claim 14, wherein the die attach paddle is connected to a low voltage level.

16. The wire bond IC package of claim 14, wherein each of the plurality of lead fingers has an inwardly extending end that forms a circular peripheral region around the die attach paddle.

17. The wire bond IC package of claim 14, wherein each of the plurality of lead fingers that extends in the single direction extends towards the die attach paddle, and wherein each of the plurality of lead fingers that extends in two directions extends towards each other.

18. The wire bond IC package of claim 14, wherein an inner end of each of the adjacent lead fingers extends past the one of the plurality of lead fingers.

19. The wire bond IC package of claim 18, wherein the inner end of each of the adjacent lead fingers is wider than an inner end of the one of the plurality of lead fingers.

* * * * *